(12) United States Patent
Masuda

(10) Patent No.: US 6,452,233 B1
(45) Date of Patent: Sep. 17, 2002

(54) SOI DEVICE HAVING A LEAKAGE STOPPING LAYER

(75) Inventor: Takashi Masuda, Tokorozawa (JP)

(73) Assignee: Citizen Watch Co., Ltd., Tokyo (JP)

( * ) Notice: Subject to any disclaimer, the term of this patent is extended or adjusted under 35 U.S.C. 154(b) by 0 days.

(21) Appl. No.: 09/531,893

(22) Filed: Mar. 21, 2000

(30) Foreign Application Priority Data

Mar. 23, 1999 (JP) .............................. 11-077315

(51) Int. Cl.[7] ............................... H01L 27/01
(52) U.S. Cl. .................. 257/349; 257/347; 257/353; 257/354
(58) Field of Search ................. 257/347, 349, 257/351, 353, 354; 438/154, 164

(56) References Cited

U.S. PATENT DOCUMENTS

| | | | | |
|---|---|---|---|---|
| 4,507,158 A | * | 3/1985 | Kamins et al. | 438/413 |
| 4,797,721 A | * | 1/1989 | Hsu | 257/354 |
| 4,969,023 A | * | 11/1990 | Svedberg | 257/347 |
| 5,144,390 A | * | 9/1992 | Matloubian | 257/347 |
| 5,185,280 A | * | 2/1993 | Houston et al. | 438/163 |
| 5,489,792 A | * | 2/1996 | Hu et al. | 257/347 |
| 5,578,865 A | * | 11/1996 | Vu et al. | 257/611 |
| 5,684,318 A | * | 11/1997 | Ayres et al. | 257/334 |
| 5,818,085 A | * | 10/1998 | Hsu et al. | 257/347 |
| 5,837,597 A | * | 11/1998 | Saito | 438/528 |
| 5,929,490 A | * | 7/1999 | Onishi | 257/347 |

FOREIGN PATENT DOCUMENTS

| | | | | |
|---|---|---|---|---|
| JP | 3-63-278273 | * | 11/1988 | 257/354 |
| JP | 4-07-50400 | * | 2/1995 | H01L/27/12 |

* cited by examiner

*Primary Examiner*—George C. Eckert, II
(74) *Attorney, Agent, or Firm*—Armstrong, Westerman & Hattori, LLP

(57) ABSTRACT

A lightly doped region (3) of N-type or P-type isolated from one component region and another is formed out of a surface silicon layer of an SOI substrate (1), a gate electrode (21) is provided above the lightly doped region (3) with a gate oxidation film (15) therebetween, a drain region (5) and a source region (7) made by making the lightly doped region (3) on the front face side different in conduction type from the lightly doped region (3) are provided respectively on both sides of the gate electrode (21), and a leakage stopping layer (13) which is the same in conduction type as the lightly doped region (3) and higher in impurity concentration than the lightly doped region (3) is provided between the source region (7) and a buried oxidation film (19).

2 Claims, 15 Drawing Sheets

SOI DEVICE HAVING A LEAKAGE STOPPING LAYER

BACKGROUND OF THE INVENTION

1. Field of the Invention

The present invention relates to a semiconductor device using an SOI substrate having an SOI (Silicon On Insulator) structure in which a buried oxidation film and a surface silicon layer are provided on a support substrate made of silicon and a method of fabricating the same.

2. Description of the Related Art

The SOI substrate is a semiconductor substrate where a surface silicon layer is formed above a support substrate made of silicon with a buried oxidation film therebetween. The semiconductor device fabricated using such SOI substrate has a lot of advantages compared with a semiconductor device fabricated with bulk silicon. For instance, these advantages are that the semiconductor device with the SOI substrate has high resistance to temperature and radiation, capability of realizing quick operation with ease, low power consumption, and so on.

Hereinafter, an example of a semiconductor device using a conventional SOI substrate will be described with FIG. 13.

FIG. 13 is a sectional view showing the enlarged principal portion of an IC chip that is the semiconductor device using the conventional SOI substrate.

In an SOI substrate 1, a buried oxidation film 19 is provided on a support substrate 17 made of silicon and a surface silicon layer is provided on the buried oxidation film 19. However, in FIG. 13, the surface silicon layer is etched to form a plurality of island-shaped component regions and impurities are implanted into each component region and diffused to form a lightly doped P region 3 and a lightly doped N region 4.

An N channel field effect transistor (hereinafter referred to as "an N channel FET") 20 and a P channel field effect transistor (hereinafter referred to as "a P channel FET") 30 are provided respectively on the lightly doped P region 3 and the lightly doped N region 4 isolated from each other by an insulating film 23.

In the N channel FET 20, a gate electrode 21 is formed above the center of the lightly doped P region 3 with a gate oxidation film 15 therebetween, and an N source region 7 and an N drain region 5 are formed respectively on both sides of the gate electrode 21. The gate electrode 21, the N source region 7, and the N drain region 5 are respectively provided with metal electrodes (interconnection electrodes) 11 electrically connected thereto and extending onto the insulating film 23 through contact holes 31.

In the P channel FET 30, a gate electrode 21 is formed above the center of the lightly doped N region 4 with a gate oxidation film 15 therebetween, and a P source region 27 and a P drain region 25 are formed respectively on both sides of the gate electrode 21. The gate electrode 21, the P source region 27, and the P drain region 25 are also respectively provided with metal electrodes (interconnection electrodes) 11 electrically connected thereto and extending onto the insulating film 23 through contact holes 31.

Incidentally, since the metal electrodes (interconnection electrodes) connecting with the gate electrodes 21 of the N channel FET 20 and the P channel FET 30 are respectively provided at positions in a section different from FIG. 13, they are not shown in FIG. 13. Moreover, pad portions for providing input/output terminals are formed at the metal electrodes 11 connecting with the outside out of a number of metal electrodes 11, though the illustration thereof is omitted.

The N channel FET 20 and the P channel FET 30 are merely inverse in conduction type of the lightly doped region, the source region, and the drain region, and they have a common basic structure. The pair of N channel FET 20 and P channel FET 30 constitute a CMOS transistor.

In FIG. 13, only one pair of CMOS transistors is shown, but a number of CMOS transistors, other FETs, bipolar transistors, resistors, or capacitors are provided in an actual IC chip. All of these are, of course, made by the SOI technology.

When the IC chip which is the semiconductor device using the aforesaid SOI substrate is operated, it is necessary to ground or bias the support substrate at a predetermined voltage. Thereby, the operation of the IC chip can be stabilized.

However, in the case where the IC chip in which the CMOS transistor is formed on the SOI substrate as shown in FIG. 13 is driven, the support substrate 17 made of silicon is grounded or biased, which causes the following disadvantage.

In one of the FETs composing the CMOS transistor, the support substrate 17 comes to be different in potential from the lightly doped P region 3 or the lightly doped N region 4 which are formed out of the surface silicon layer. For instance, as shown in FIG. 13, when the support substrate is set at the ground potential, the lightly doped P region 3 of the N channel FET 20 is set at the ground potential but the lightly doped N region 4 of the P channel FET 30 must be set at a power source potential (by an applied voltage VDD). Therefore, a potential difference is caused between the lightly doped N region 4 and the support substrate 17.

So, the disadvantage due to an occurrence of such potential difference will be explained with reference to FIG. 14 and FIG. 15 showing an enlarged portion of only one P channel FET 30 in FIG. 13. Incidentally, in the sectional views, part of the hatching is omitted for convenience of illustration.

The lightly doped N region 4 and the P source region 27 in FIG. 14 form a PN junction, normally the P source region 27 is set at the power source potential, and carriers come into recombination in the lightly doped N region 4 near a boundary surface between the lightly doped N region 4 and the P source region 27, whereby a depletion layer 34 is formed as shown in the drawing.

If the value of the voltage VDD applied to the lightly doped region 4 is changed to the positive voltage side, electrons in the lightly doped N region 4 near a boundary surface 39 between the lightly doped N region 4 and the buried oxidation side 19 are excluded, whereby a depletion layer 35 is formed. When the applied voltage VDD becomes about 5V, an inversion layer 36 composed of holes is formed near the boundary surface 39 and the depletion layer 35 growing from the buried oxidation 19 side and the depletion layer 34 growing from the P source region 27 are joined finally.

At this time, the potential difference between the support substrate 17 and the lightly doped N region 4 comes to directly exert on the PN junction formed at the boundary surface between the lightly doped N region 4 and the P source region 27, and thus the potential barrier of the PN junction is lowered, whereby carriers (holes) 37 are supplied from the P source region 27 to the inversion layer 36 as shown by an arrow a in FIG. 15.

On the other hand, since the P drain region 25 is normally applied with a drain voltage Vd with which the P drain region 25 is reverse-biased in relation to the lightly doped N region 4, the carriers (holes) 37 flow from the inversion layer 36 into the P drain region 25 as shown by an arrow c. Consequently, a leakage current appears along the boundary surface 39 as shown by an arrow b, resulting in the formation of a path of current in addition to the channel current. When the leakage current appears as described above, a current flows even when no voltage is applied to the gate electrode 21, whereby the current flowing in the channel cannot be controlled accurately by the voltage applied to the gate electrode 21.

In other words, there is a disadvantage that a leakage current flowing along the boundary surface 39 between the lightly doped N region 4 and the buried oxidation film 19 appears due to the potential difference between the voltage VDD applied to the lightly doped N region 4 and the support substrate 17, resulting in inaccurate control of the channel current.

It is possible that the above disadvantage arises not only in the P channel FET 30 but also in the N channel FET 20. In the case of the N channel FET 20 shown in FIG. 13, there is no potential difference between the lightly doped P region 3 and the support substrate 17 by grounding the lightly doped P region 3, and thus there appears no leakage current in the lightly doped P region 3 at the boundary surface between the lightly doped P region 3 and the buried oxidation film 19.

However, when the voltage VDD is applied to the support substrate 17, though no leakage current appears since the same voltage VDD is applied to the lightly doped N region 4 of the P channel FET 30, the lightly doped P region 3 of the N channel FET 20 needs to be set at the ground potential, which causes a potential difference between the lightly doped P region 3 and the support substrate 17, resulting in appearance of a leakage current.

Consequently, the aforesaid disadvantage due to the leakage current arises in any one of the N channel FET 20 and the P channel FET 30 which compose the CMOS transistor on the SOI substrate.

Moreover, not limited to the CMOS transistor, the same disadvantage arises in a semiconductor device in which N channel FETs and P channel FETs are provided in a mixed manner on an SOI substrate.

SUMMARY OF THE INVENTION

The present invention is made to solve the above disadvantage which arises at the time when the semiconductor device (IC chip) using the SOI substrate is used, and an object thereof is to prevent occurrence of a leakage current in the semiconductor device regardless of a voltage applied to a support substrate made of silicon so as to accurately control a channel current.

In order to attain the above object, the semiconductor device according to the present invention is characterized in a semiconductor device in which a field effect transistor is formed on an SOI substrate provided with a surface silicon layer above a support substrate made of silicon with a buried oxidation film therebetween, wherein a lightly doped region of N-type or P-type isolated from one component region and another is formed out of the surface silicon layer of the SOI substrate; a gate electrode is provided above the lightly doped region with a gate oxidation film therebetween, a drain region and a source region made by making the lightly doped region on the front face side different in conduction type from the lightly doped region are provided respectively on both sides of the gate electrode; and a leakage stopping layer which is the same in conduction type as the lightly doped region and higher in impurity concentration than the lightly doped region is provided between the source region and the buried oxidation film.

Since the impurity concentration of the leakage stopping layer provided between the source region and the buried oxidation film is higher than that of the lightly doped region N-type of P-type in the semiconductor device structured as described above, even if there is a potential difference between the support substrate of silicon and the lightly doped region, a depletion layer between the source region and the buried oxidation film becomes hard to grow, whereby the joining together of the depletion layer on the source region side and the depletion layer on the buried oxidation film side is avoided. Therefore, even if an inversion layer occurs in the lightly doped region near the boundary surface between the lightly doped region and the buried oxidation film due to the above potential difference, carriers are not supplied from the source region into the inversion layer, resulting in no flow of leakage current.

Moreover, it is suitable that the leakage stopping layer is provided within an area, which contacts the buried oxidation film and does not contact the source region, in the lightly doped region, or within an area, which contacts neither the source region nor the buried oxidation film, in the lightly doped region.

It is preferable that the leakage stopping layer is thus provided away from the gate electrode, which exerts less influence on the control characteristic of the channel current by the gate voltage.

The fabricating method of a semiconductor device according to the present invention is characterized in a fabricating method of a semiconductor device in which a field effect transistor is formed on an SOI substrate, comprising the steps of:

preparing the SOI substrate provided with a surface silicon layer above a support substrate made of silicon with a buried oxidation film therebetween and selectively etching the surface silicon layer to form a lightly doped region of N-type or P-type isolated from one component region and another;

selectively ion-implanting impurities which are the same in conduction type as the lightly doped region into a portion which will be a source region in the lightly doped region to form a leakage stopping layer;

performing oxidation treatment for the front face of the lightly doped region to form a gate oxidation film;

forming a gate electrode on the gate oxidation film; and selectively ion-implanting impurities which are different in conduction type from the lightly doped region into the lightly doped region on both sides of the gate electrode and the leakage stopping layer to form a drain region and a source region.

A more complete semiconductor device can be fabricated by further comprising the steps of:

after the step of forming the drain region and the source region, forming an insulating film on the entire face of the SOI substrate which has been subjected to the aforesaid steps;

performing photo etching treatment for the insulating film to form contact holes at positions in the insulating film which individually correspond to the gate electrode, the drain region, and the source region; and forming a metal electrode layer on the entire face of the insulating film and in all the contact holes and thereafter performing photo etching treatment to form metal electrodes individually connecting to the gate electrode, the drain region, and the source region separately in the respective contact holes.

The above and other objects, features and advantages of the invention will be apparent from the following detailed description which is to be read in conjunction with the accompanying drawings.

DETAILED DESCRIPTION OF THE PREFERRED EMBODIMENTS

Figure 1:
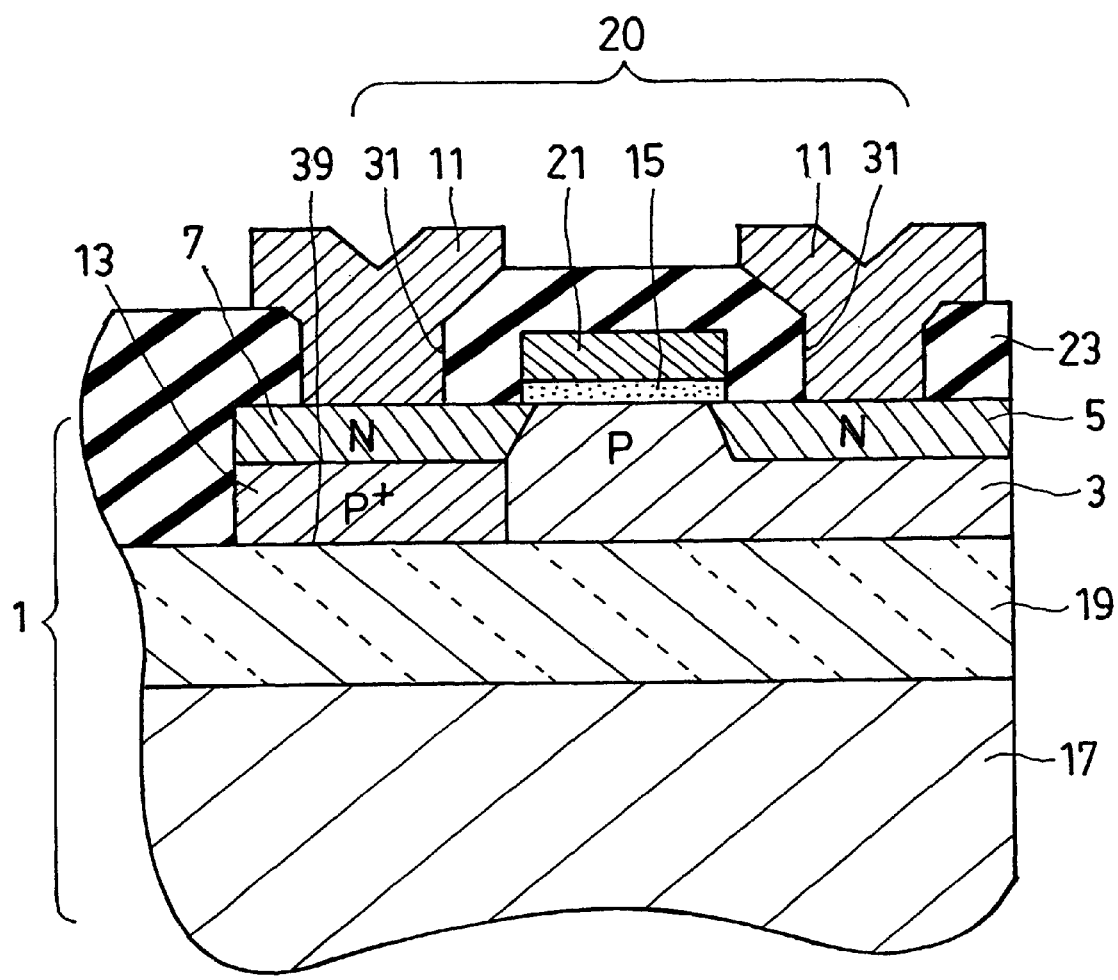
FIG. 1 is a schematic sectional view showing an enlarged principal portion of a semiconductor device according to the present invention.

Hereinafter the preferred embodiments of the present invention will be described with reference to the drawings.
Structure of a semiconductor device: FIG. 1

Figure 13:
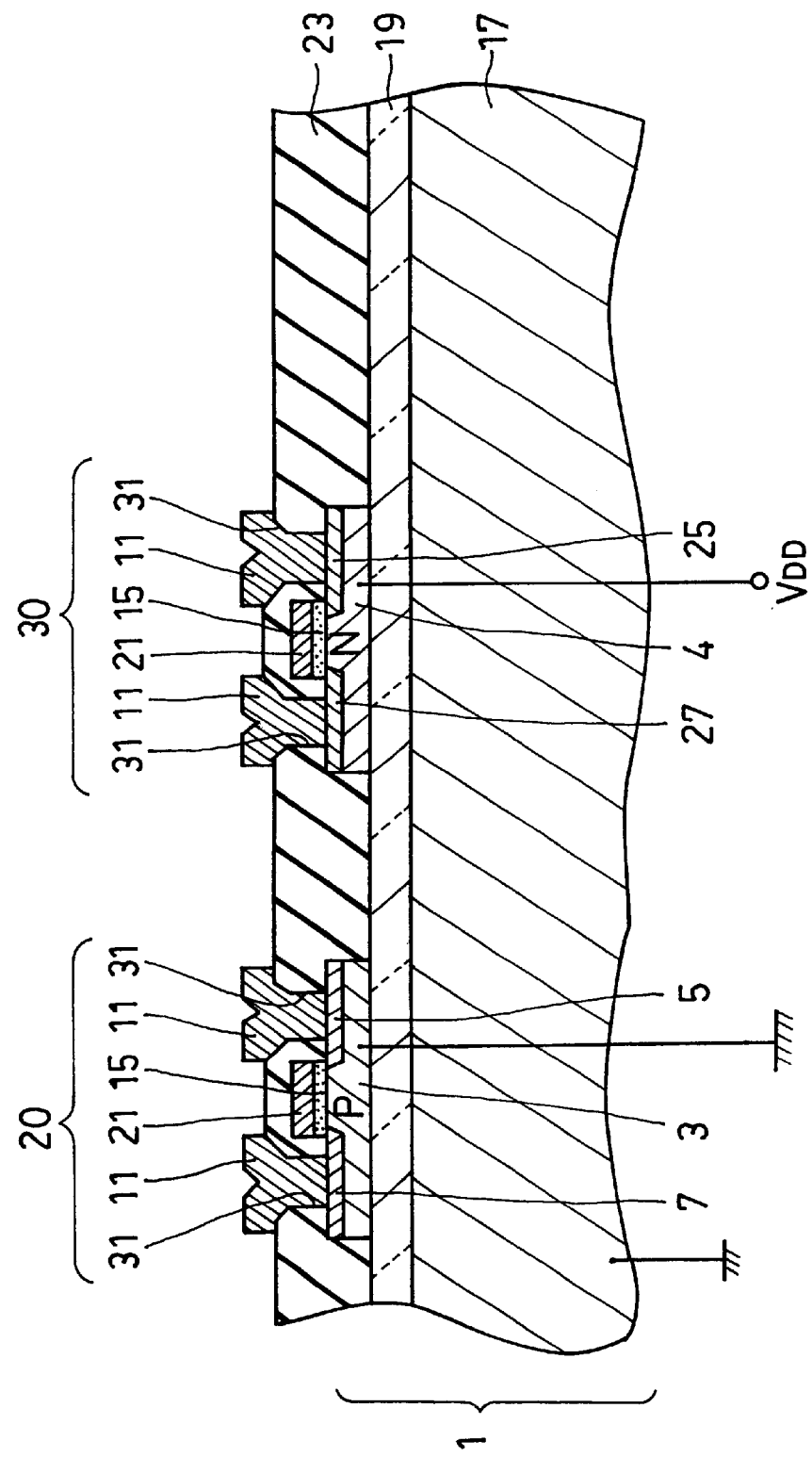
FIG. 13 is a sectional view showing principal portion of a conventional semiconductor device with a CMOS structure using an SOI substrate.
Figure 14:
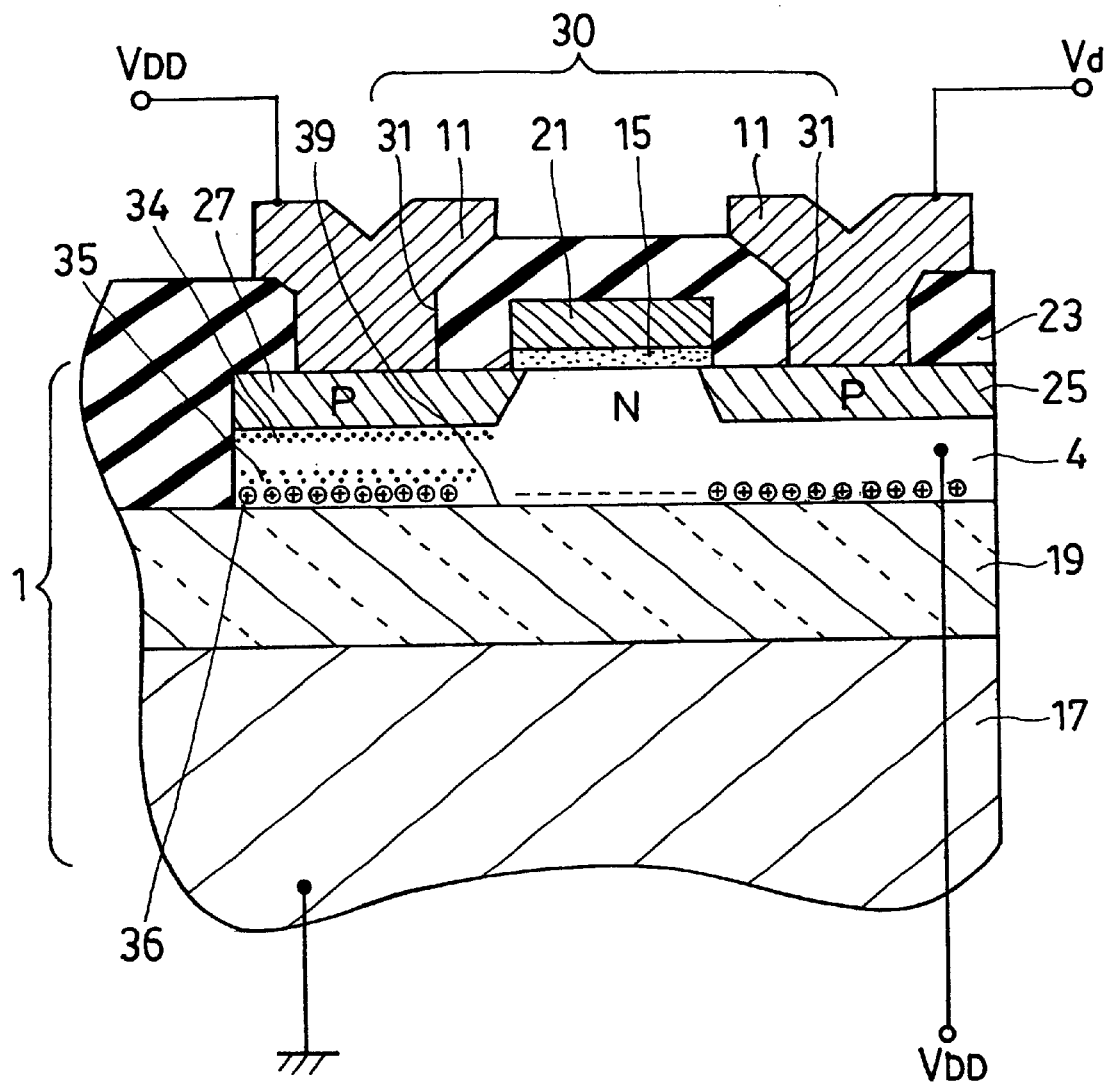
FIG. 14 is a sectional view showing an enlarged portion of only a P channel FET for explaining the disadvantage of the semiconductor device shown in FIG. 13.
Figure 15:
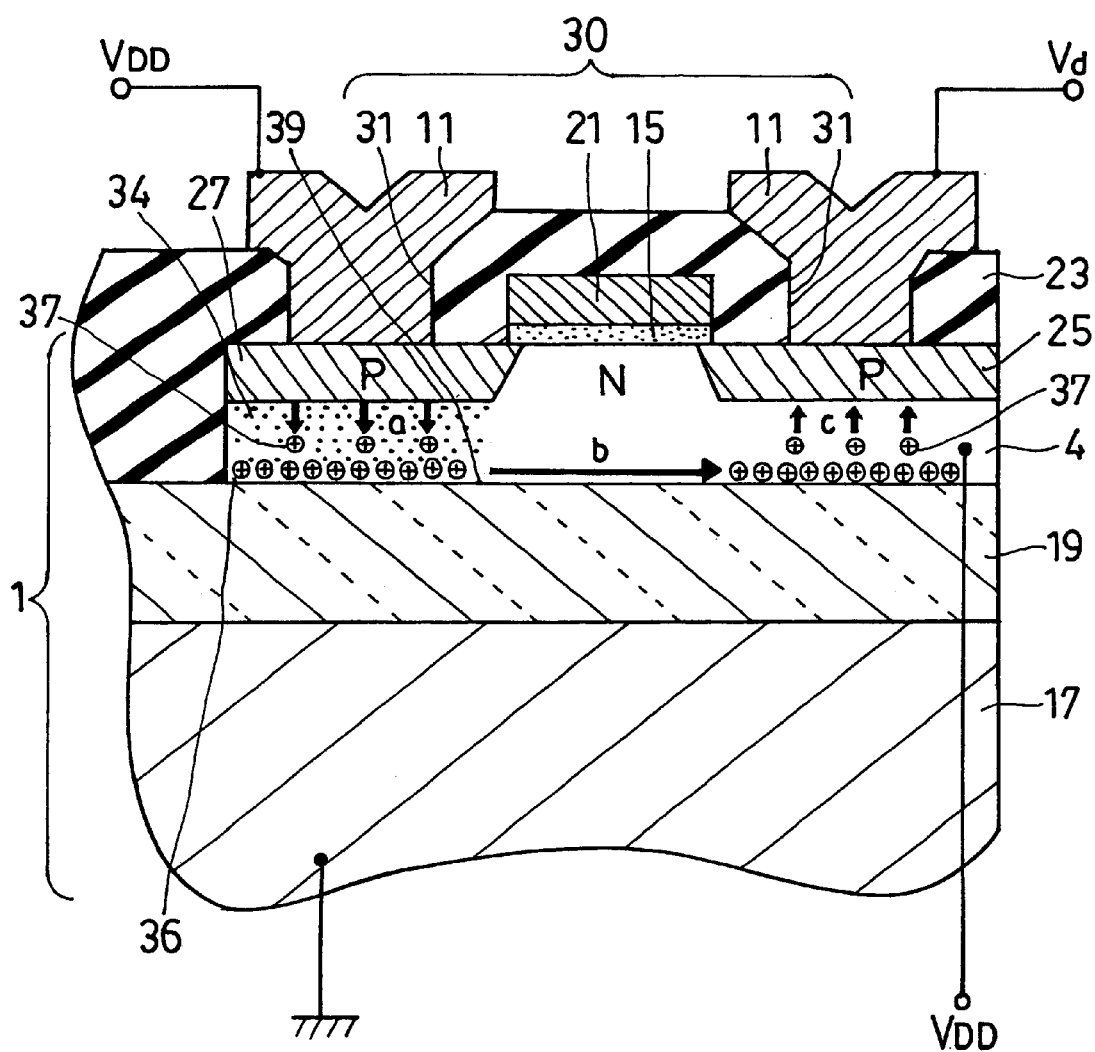
FIG. 15 is a sectional view, similar to FIG. 14, for explaining the flow of a leakage current of the semiconductor device shown in FIG. 13.

FIG. 1 is a schematic sectional view showing an enlarged principal portion of the semiconductor device according to the present invention, in which a portion of an N channel FET of a CMOS transistor is enlarged and the other portion is omitted similarly to FIG. 14. In the following description, the same numerals and symbols are given to portions corresponding to those of the conventional example shown in FIG. 13 to FIG. 15.

The semiconductor device shown in FIG. 1 uses an SOI substrate 1 in which a buried oxidation film 19 is provided on a support substrate 17 made of silicon and a surface silicon layer is provided on the buried oxidation film 19 as in the conventional semiconductor device described with FIG. 13. In this semiconductor device, a number of N channel FETs 20 and the same P channel FETs as the P channel FET 30 shown in FIG. 13 isolated from other components by an insulating film 23 made of a silicon oxidation film which are doped with boron atoms and phosphorus atoms are provided on the buried oxidation film 19 to form an IC chip.

The buried oxidation film 19 has a film thickness of about 0.1 $\mu$m to about 5 $\mu$m, preferably about 1 $\mu$m. The surface silicon layer with a film thickness of about 0.1 $\mu$m to about 1 $\mu$m, preferably about 1 $\mu$m is provided on the buried oxidation film 19. However, in FIG. 1, the surface silicon layer is etched to form a plurality of island-shaped component regions and impurities are implanted into the surface silicon layer and diffused to form a lightly doped P region 3.

In the N channel FET 20, a gate electrode 21 is formed at the center above the lightly doped P region 3 with a gate oxidation film 15 therebetween, and an N source region 7 and an N drain region 5 are formed respectively on both sides of the gate electrode 21. The gate electrode 21, the N source region 7 and the N drain region 5 are respectively provided with metal electrodes (interconnection electrodes) 11 electrically connected thereto and extending onto the insulating film 23 through contact holes 31. It should be noted that the gate oxidation film 15 is made of a silicon oxidation film and the gate electrode 21 is made of polycrystalline silicon. Aluminum is used for the metal electrode 11 and phosphorus atoms are used as impurities for the N source region 7 and the N drain region 5.

Since the metal electrode (interconnection electrode) connecting with the gate electrode 21 is provided at a position in a section different from FIG. 1, it is not shown in FIG. 1. Moreover, pad portions for providing input/output terminals are formed at the metal electrodes 11 connecting with the outside out of a number of metal electrodes 11 though the illustration thereof is omitted.

In FIG. 1, only the N channel FET 20 composing the CMOS transistor is shown, but a number of CMOS transistors, other FETs, bipolar transistors, resistors or capacitors are provided in an actual IC chip. The above configuration is the same as that of the conventional semiconductor device shown in FIG. 13.

This semiconductor device is different from the conventional semiconductor device shown in FIG. 13 in the following point.

That is the point that a leakage stopping layer 13 is provided in the lightly doped P region 3 between the N source region 7 and the buried oxidation film 19.

This leakage stopping layer 13 is the same in conduction type as the lightly doped P region 3 but it is formed to be increased in concentration of the impurities and contacts both the N source region 7 and the buried oxidation film 19 in this example. The concrete impurity concentrations of the leakage stopping layer 13 and the lightly doped P region 3 will be described later.

Since the leakage stopping layer 13 is higher in impurity concentration than the lightly doped P region 3, even if the lightly doped P region 3 is grounded and a positive voltage VDD is applied to the support substrate 17 resulting in occurrence of a potential difference between the lightly doped P region 3 and the support substrate 17, depletion layers near a boundary surface 39 between the leakage stopping layer 13 and the buried oxidation film 19 and near a boundary surface between the leakage stopping layer 13 and the N source region 7 are hard to grow. Accordingly, even if depletion layers are formed, formation of both depletion layers to an extent that they link each other is avoided.

Therefore, even if an inversion layer is formed in the lightly doped P region 3 near the boundary surface 39 between the lightly doped P region 3 and the buried oxidation film 19 due to a potential difference between the lightly doped P region 3 and the support substrate 17, the potential barrier between the lightly doped P region 3 and the N source region 7 is maintained. If this potential barrier is maintained, carriers (electrons) are not supplied from the N source region 7, so that such a leakage current along the boundary surface 39 as has been described with FIG. 15 never appears. Accordingly, the current flowing in the channel can be accurately controlled by the voltage (gate voltage) applied to the gate electrode 21.

Figure 2:
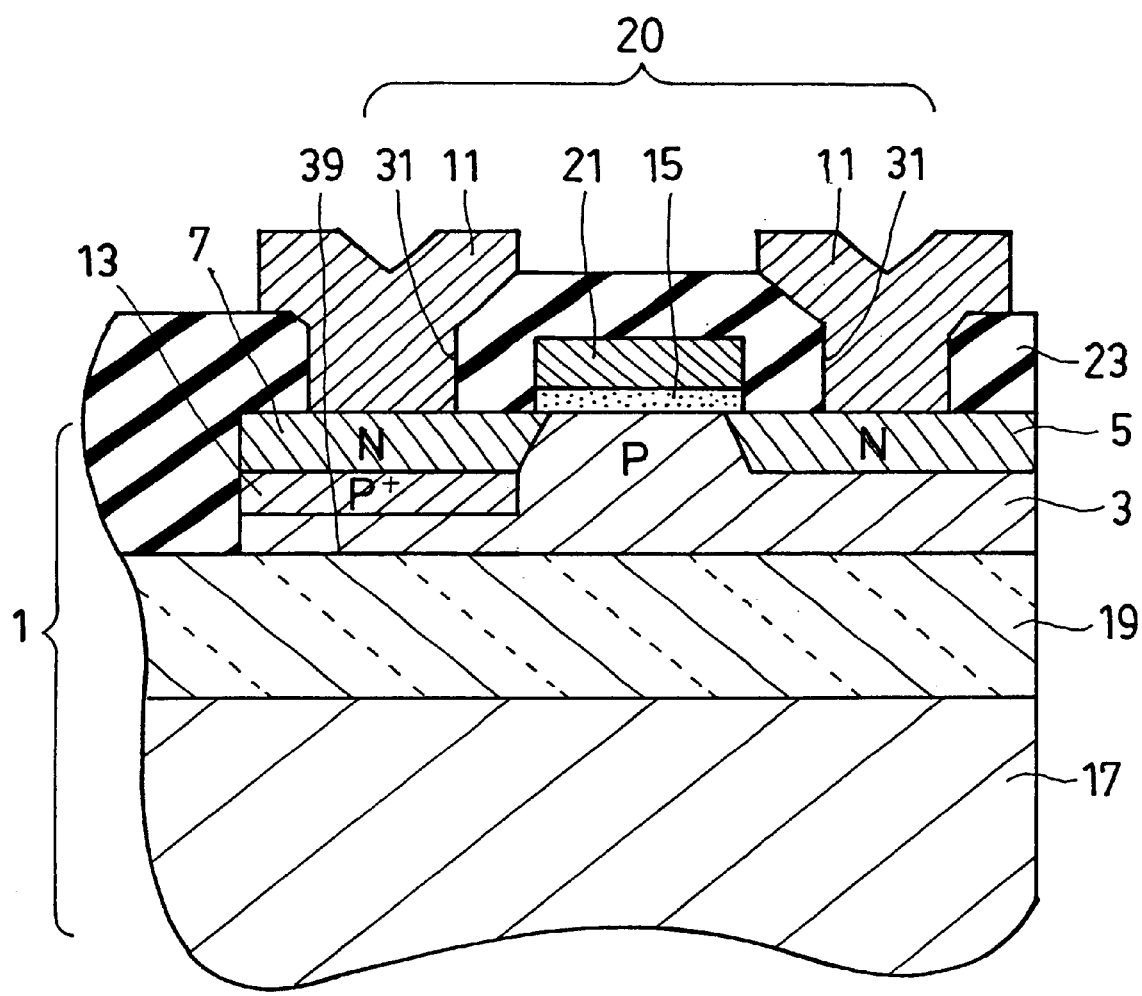
FIG. 2 is a schematic sectional view showing an enlarged principal portion of a semiconductor device in which the position of a leakage stopping layer is different from that of the semiconductor device shown in FIG. 1.
Figure 3:
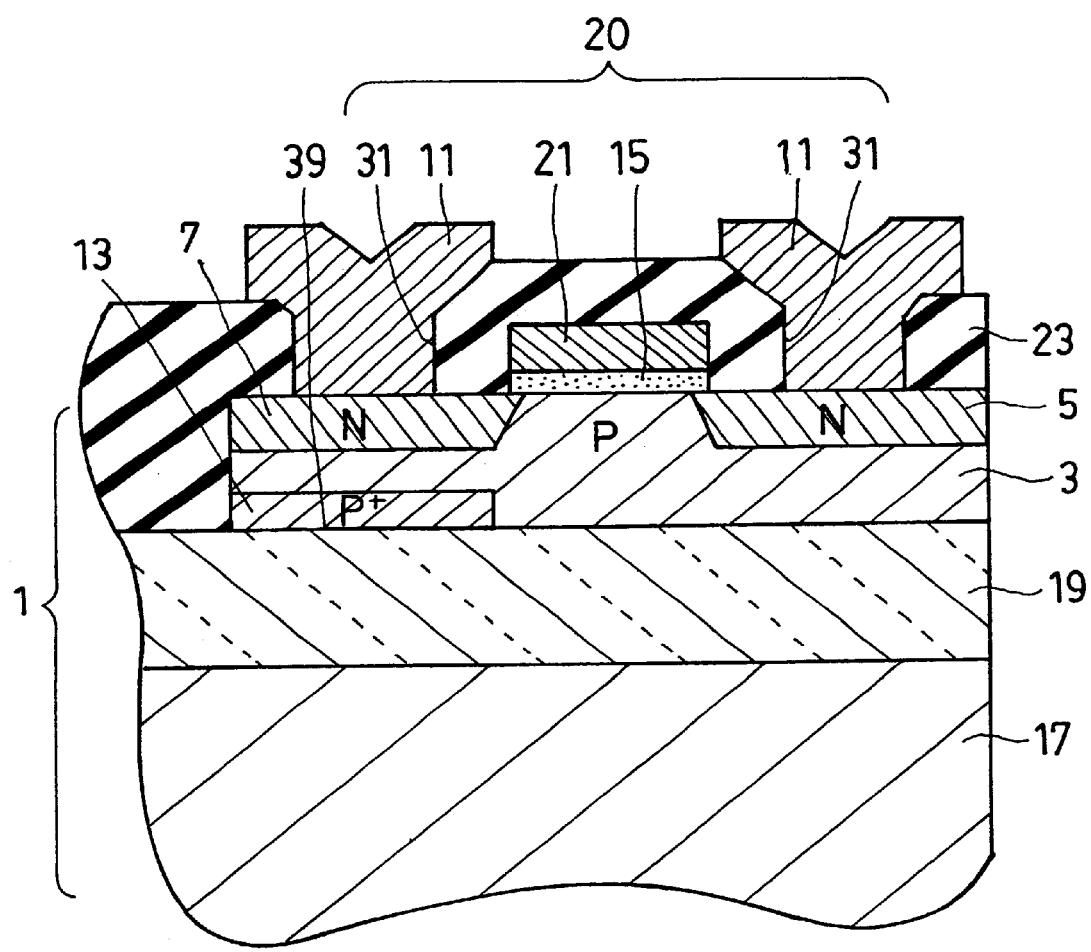
FIG. 3 is a schematic sectional view showing an enlarged principal portion of another semiconductor device in which the position of a leakage stopping layer is different from that of the semiconductor device shown in FIG. 1.

The leakage stopping layer 13 shown in FIG. 1 is formed to contact both the N source region 7 and the buried oxidation film 19, but this leakage stopping layer 13 may be formed to contact the N source region 7 but not to contact the buried oxidation film 19 as shown in FIG. 2. Alternatively, the leakage stopping layer 13 may be formed not to contact the N source region 7 but to contact the buried oxidation film 19 as shown in FIG. 3.

Figure 4:
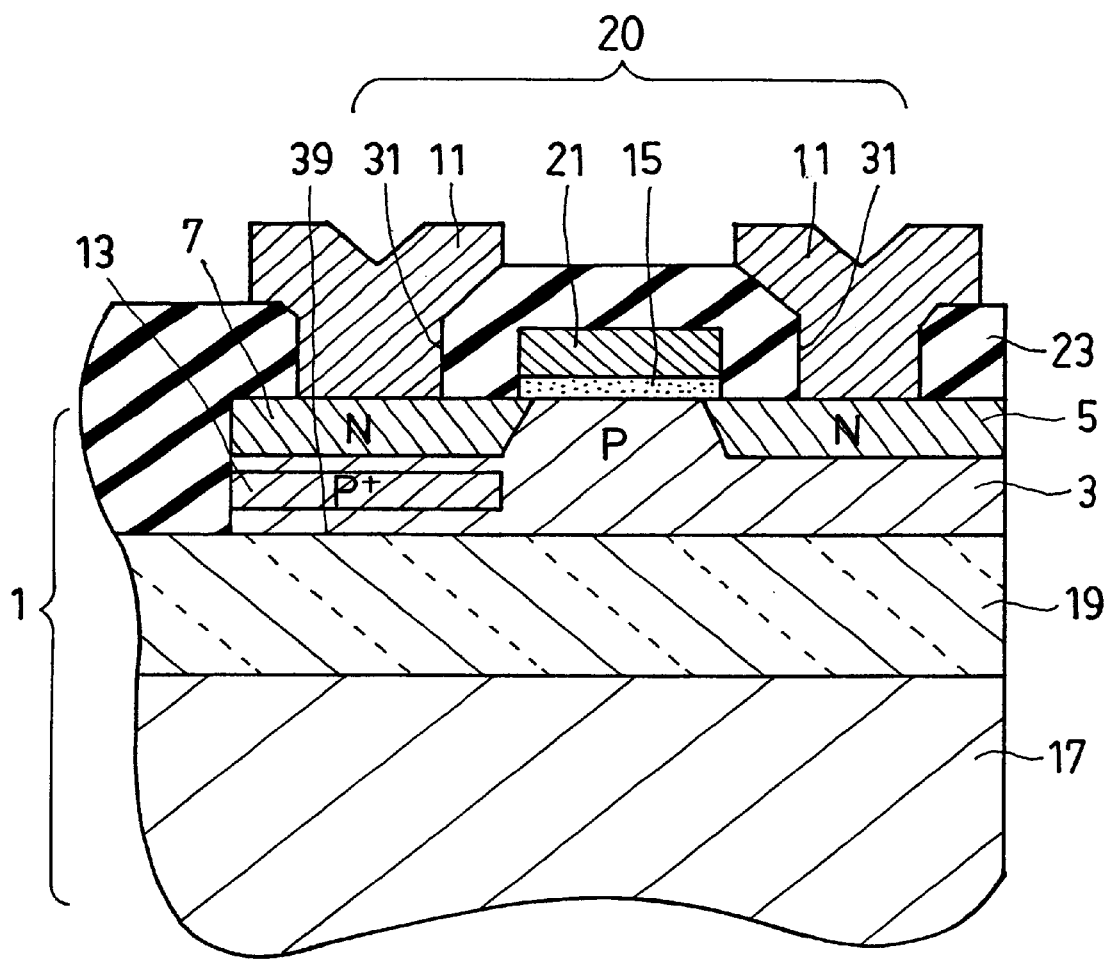
FIG. 4 is a schematic sectional view showing an enlarged principal portion of still another semiconductor device in which the position of a leakage stopping layer is different from that of the semiconductor device shown in FIG. 1.

Moreover, the leakage stopping layer 13 may be formed to contact neither the N source region 7 nor the buried oxidation film 19 as shown in FIG. 4. Any of the leakage stopping layers 13 shown in FIG. 2 to FIG. 4 can block or suppress growth of depletion layers to thereby prevent occurrence of a leakage current as in the case of the leakage stopping layer 13 shown in FIG. 1.

However, the leakage stopping layer 13 is formed farther away from the gate electrode 21, which exerts less influence on the control characteristic of the channel current by the gate voltage. In this consideration, it is preferable to form the leakage stopping layer 13 at a position shown in FIG. 3 or FIG. 4 than that in FIG. 2, and more preferable to employ the structure shown in FIG. 3.

Further, the leakage stopping layer 13 needs to be provided between the N source region 7 and the buried oxidation film 19. The provision of the leakage stopping layer 13 between the N drain region 5 and the buried oxidation film 19 causes a fall in drain breakdown voltage.

When the semiconductor device in which the CMOS transistor is formed on the SOI substrate 1 is used applying a power source voltage to the support substrate 17, it is suitable to provide the leakage stopping layer 13 in the N channel FET as in the above embodiment and it is unnecessary to provide a leakage stopping layer in the P channel FET which is the companion to the N channel FET.

However, when the semiconductor device is used grounding the support substrate 17, it is suitable to provide a leakage stopping layer in the P channel FET and it is unnecessary to provide a leakage stopping layer in the N channel FET. In this case, since the conduction type of the lightly doped region of the P channel FET is N-type, the leakage stopping layer is made into high concentration N-type, and the drain region and the source region are made into P-type.

Figure 5:
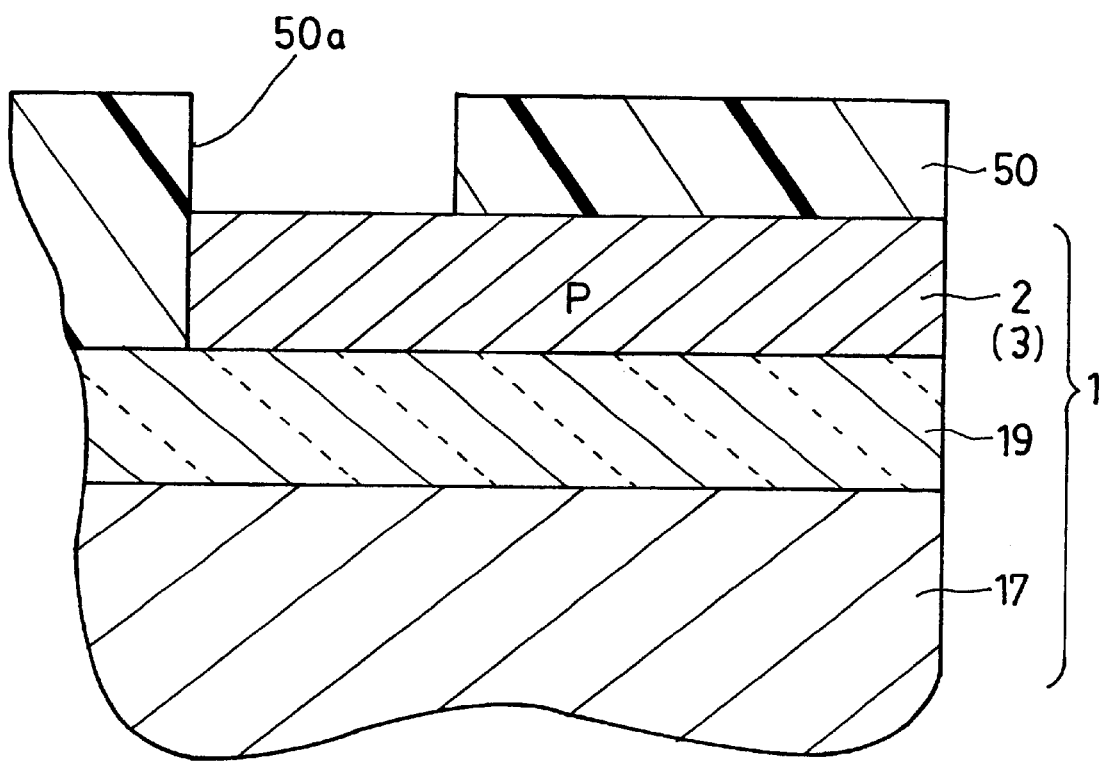
FIG. 5 through FIG. 12 are schematic sectional views, similar to FIG. 1, orderly showing each step for explaining a fabricating method of the semiconductor device according to the present invention.

The above configuration is not limited to the CMOS transistor and is also employed in the case where N channel FETs and P channel FETs are formed separately and in a mixed manner on an SOI substrate, and it is suitable to provide leakage stopping layers in one type of the FETs.
Method of fabricating the semiconductor device: FIG. 1 and FIG. 5 through to FIG. 12

Figure 12:
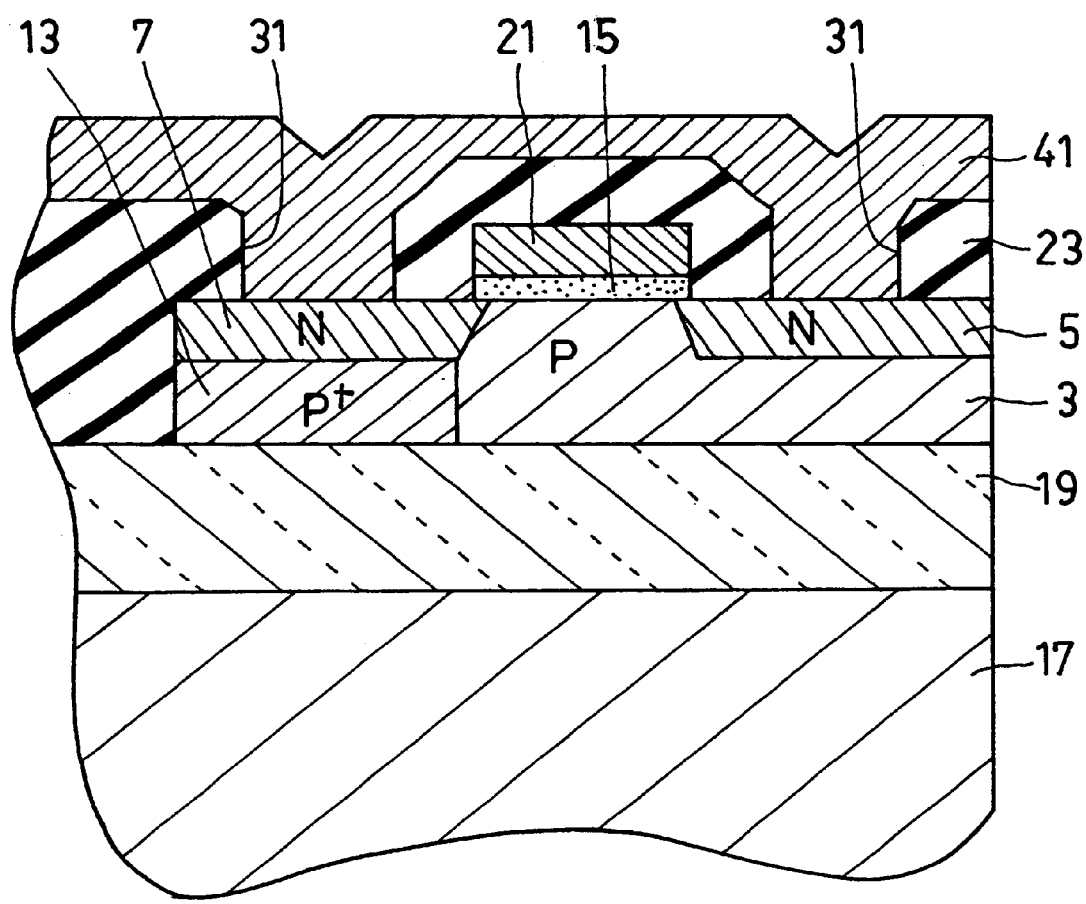

Next, the method of fabricating the semiconductor device shown in FIG. 1 will be described using FIG. 5 through to FIG. 12. FIG. 5 through to FIG. 12 are schematic sectional views showing the state in each step for explaining the fabricating method of the semiconductor device.

First, the SOI substrate 1 provided with the buried oxidation film 19 having a film thickness of about 0.1 $\mu$m to about 5 $\mu$m on the support substrate 17 made of silicon and with a surface silicon layer 2 having a film thickness of about 0.1 $\mu$m to about 1 $\mu$m on the buried oxidation film 19 shown in FIG. 5 is prepared for use. Then, a photoresist (not shown) is applied on the entire top face of the surface silicon layer 2 of the SOI substrate 1 by the spin coating and then exposed and developed using a predetermined photomask, so that the photoresist is patterned so as to remain only within each component region.

Here, in order to form the lightly doped P region 3 out of the surface silicon layer 2, the SOI substrate 1 having the surface silicon layer 2 of which the conduction type is P-type with an impurity concentration of about $1 \times 10^{16}$ cm$^{-3}$ is used. This impurity concentration is the impurity concentration of the lightly doped P region 3 shown in FIG. 1.

Sequentially, the surface silicon layer 2 is selectively etched so that a portion thereof which is not covered with the photoresist is completely removed. Thereby, a state where the lightly doped P region (3) is formed in an island shape in each component region as shown in FIG. 5 is obtained. Further, a photoresist 50 is applied on the entire face including the lightly doped P region (3) by the spin coating and exposed and developed using a predetermined photomask so that the photoresist 50 is patterned to form an opening portion 50a within a region where the leakage stopping layer 13 shown in FIG. 1 is formed.

Sequentially, using the photoresist 50 as an ion implantation barrier film, P impurities (not shown) are selectively ion-implanted under conditions in the order of 100 keV in implantation energy and $1 \times 10^{13}$ cm$^{-2}$ in implantation dose. Incidentally, boron atoms are used as the P impurities. Then, the photoresist 50 is removed with sulfuric acid (H$_2$SO$_4$). A highly doped region which will be the leakage stopping layer is formed by the above ion implantation of the P impurities.

Figure 6:
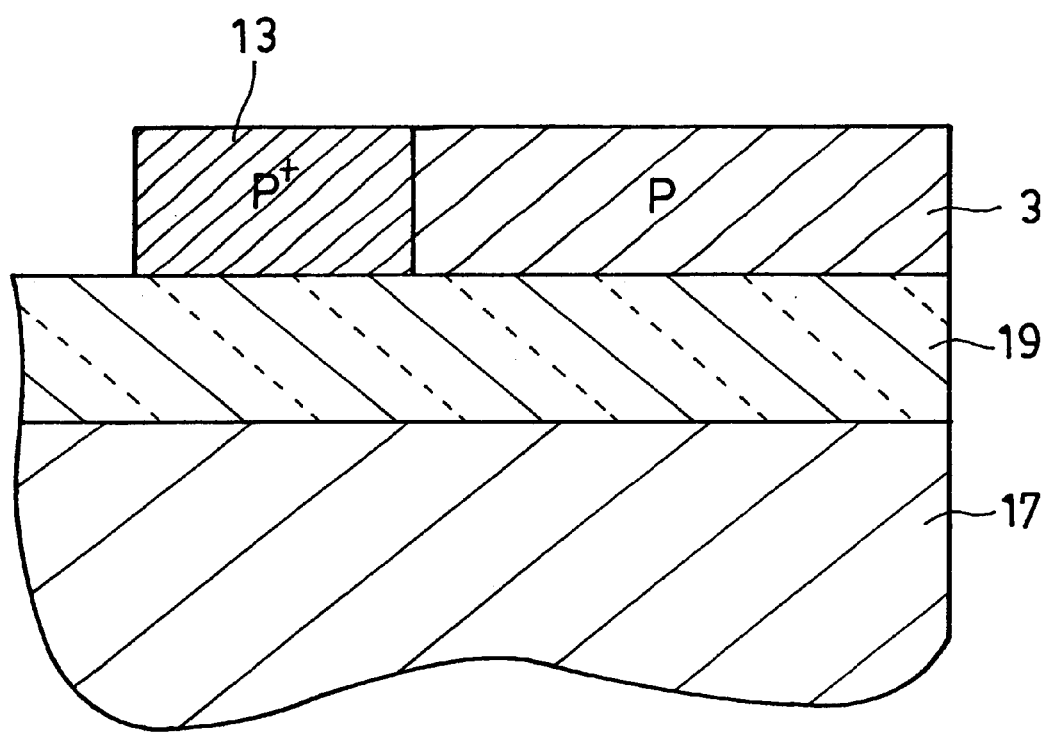

Sequentially, heat treatment is performed for about three hours at a temperature of about 1000° C. in a nitrogen atmosphere so as to diffuse the implanted impurities, whereby the leakage stopping layer 13 is formed as shown in FIG. 6.

The leakage stopping layer 13 can be formed by implanting impurities having the same conduction type as the lightly doped P region 3 and high concentration and performing heat treatment as described above. At this time, the position at which the peak of impurity concentration is formed can be controlled by controlling the implantation energy when the impurities are ion-implanted, and the depth to which the impurities are diffused, that is, the depth or the width of the leakage stopping layer 13 can be controlled by controlling the period of time for performing heat treatment.

Accordingly, the structure of the leakage stopping layer 13 can be adjusted close to any of the states shown in FIG. 1 to FIG. 4 defined by the correlation between the magnitude of the impurity implantation energy and the period of time of heat treatment. For instance, the period of time of heat treatment is three hours in the above description, but if the time is shortened to one hour, the depth of diffusion of implanted impurities decreases, whereby the leakage stopping layer 13 is formed at the position shown in FIG. 2. Meanwhile, the implantation energy is increased to a stronger level than 100 keV, the leakage stopping layer 13 is formed at the position shown in FIG. 3 or FIG. 4.

Figure 7:
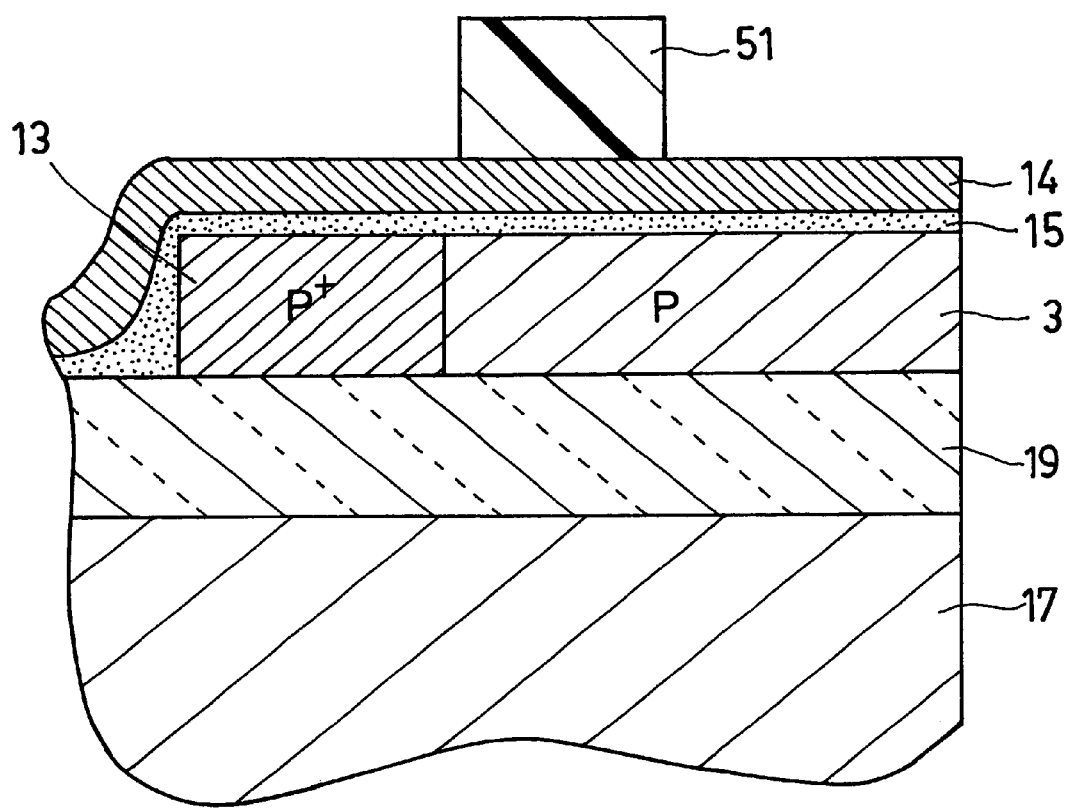

Next, heat treatment is performed for about two hours at a temperature of about 1000° C. in an oxygen atmosphere so as to form the gate oxidation film 15 with a film thickness of about 80 nm on the entire top face of the lightly doped P region 3 and the leakage stopping layer 13 as shown in FIG. 7. Further, a gate electrode layer 14 made of polycrystalline silicon is formed on the entire top face of the gate oxidation film 15 using the CVD (chemical-vapor deposition) using monosilane (SiH$_4$) as a reactive gas.

Sequentially, a photoresist 51 is applied on the entire top face of the gate electrode layer 14 by the spin coating and exposed and developed using a predetermined photomask, so that the photoresist 51 is patterned so as to remain only within the region where the gate electrode 21 as shown in FIG. 1 is formed.

Figure 8:
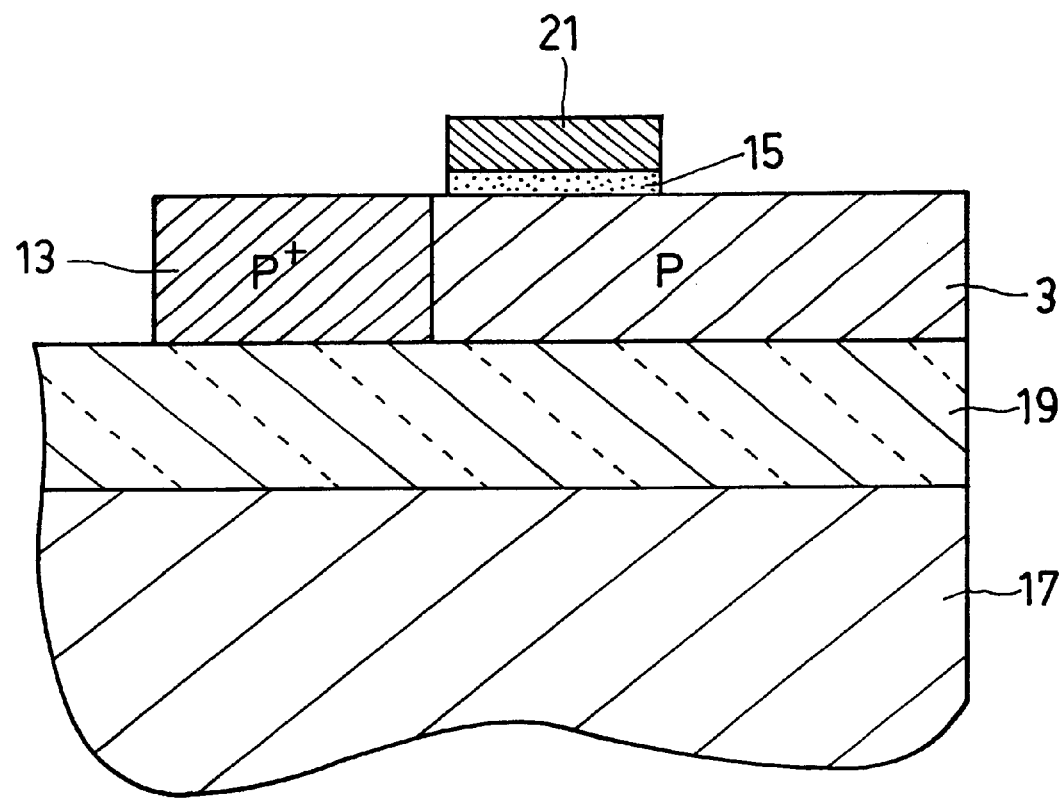

Consecutively, the gate electrode layer 14 is etched so that a portion thereof which is not covered with the photoresist 51 is completely removed by the reactive ion etching method using sulfur hexafluoride ($SF_6$) and oxygen ($O_2$) as etching gases. Thereby, the gate electrode 21 can be formed above the lightly doped P region 3 with the gate oxidation film 15 therebetween as shown in FIG. 8.

Thereafter, the photoresist 51 is removed using sulfuric acid. Incidentally, the gate electrode 15 is illustrated as if remaining only at a portion which is covered with the gate electrode 21 in FIG. 8, but some oxidation film 15 actually remains at other portions.

Figure 9:
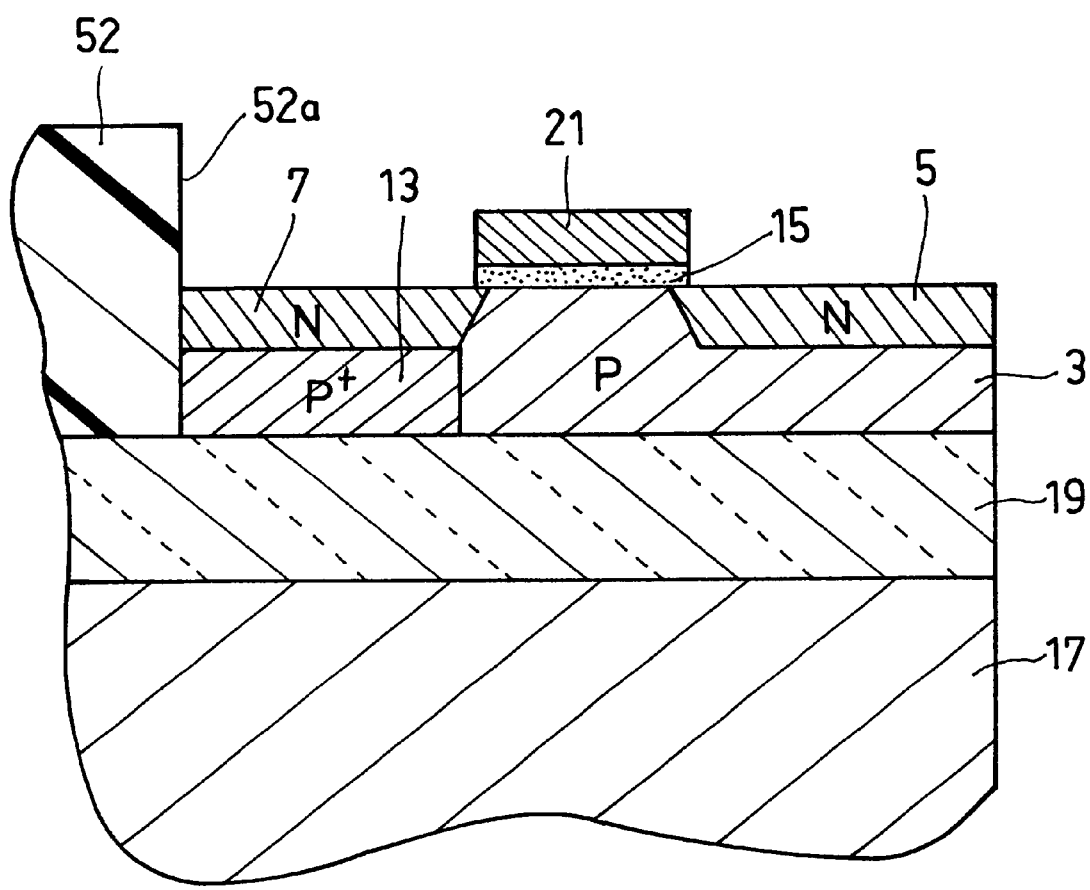

Next, a photoresist 52 is applied again on the entire top face of the buried oxidation film 19 by the spin coating and the photoresist 52 is patterned to form an opening portion 52a at a position corresponding to the component region as shown in FIG. 9.

Then, using the photoresist 52 as an ion implantation barrier film, N impurities which are opposite in conduction type to the lightly doped P region 3 are ion-implanted self-alignmently to the lightly doped P region 3 on both sides of the gate electrode 21 and the leakage stopping layer 13 of the entire top face of the SOI substrate 1 under conditions in the order of 60 keV implantation energy and $3 \times 10^{15}$ cm$^{-2}$ implantation dose. By this ion implantation, the N source region 7 can be formed on the front face side of the leakage stopping layer 13 and the N drain region 5 can be formed in the lightly doped P region 3 on the front face side which is opposite to the N source region 7 with the gate electrode 21 therebetween.

Incidentally, phosphorus atoms are used as the N impurities. Thereafter, the photoresist 52 is removed using sulfuric acid ($H_2SO_4$).

Figure 10:
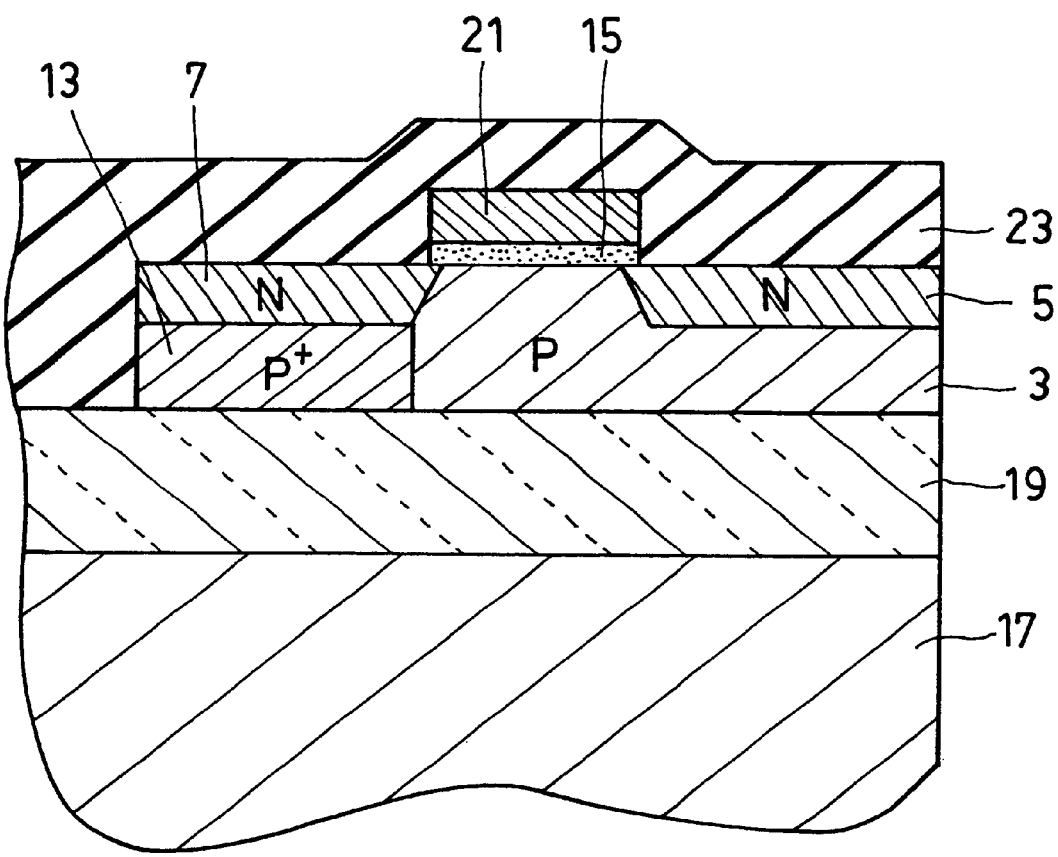

Moreover, the insulating film 23 made of silicon oxidation film including phosphorus and boron as impurities is formed to have a film thickness of about 0.5 $\mu$m to cover the entire top face of the gate electrode 21, the N source region 7, the N drain region 5, and the exposed region of the buried oxidation film 19 as shown in FIG. 10 by the CVD using monosilane, phosphine ($PH_3$), diborane ($B_2H_6$), and oxygen as reactive gases.

Thereafter, heat treatment is performed for about thirty minutes at a temperature of 900° C. in a nitrogen atmosphere. Thereby, impurities ion-implanted into the N drain region 5 and the N source region 7 are activated. The heat treatment in the nitrogen atmosphere also flattens the front face of the insulating film 23.

Figure 11:
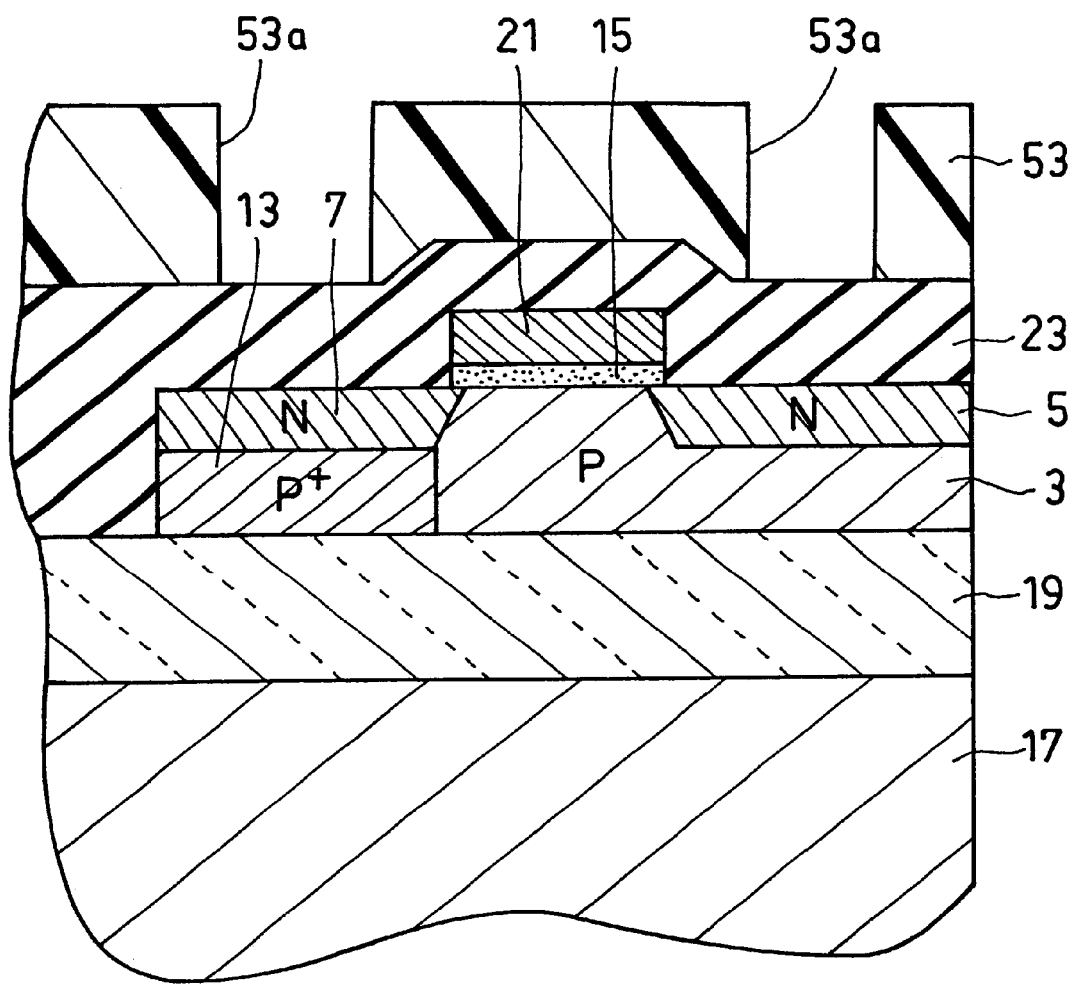

Next, a photoresist 53 shown in FIG. 11 is applied on the entire top face of the insulating film 23 by the spin coating and exposed and developed using a predetermined photomask. Thereby, the photoresist 53 is patterned so as to form opening portions 53a within regions where the contact holes are formed.

Sequentially, the insulating film 23 and the gate oxidation film 15 within each opening portion 53a of the photoresist 53 are etched to be completely removed by the reactive ion etching using carbon tetrafluoride ($CF_4$), helium (He), and methane trifluoride ($CHF_3$) as reactive gases. The respective contact holes 31 are formed at positions in the insulating film 23 individually corresponding to the gate electrode 21, the drain region 5, and the source region 7 as shown in FIG. 12. Thereafter, the photoresist 53 is removed with sulfuric acid.

Further, a metal electrode layer 41 to form metal electrodes is formed to have a film thickness of about 1 $\mu$m to cover the entire top face of the insulating film 23 and all of the contact holes 31 by the sputtering. Aluminum is used as the material of the metal electrode layer 41.

Then, a photoresist is applied on the entire top face of the metal electrode layer 41 by the spin coating and exposed and developed using a predetermined photomask, whereby the photoresist is patterned to open regions except for the regions which become metal electrodes 11.

Subsequently, the metal electrode layer 41 is etched by the reactive ion etching using boron trifluoride ($BCl_3$) and chlorine ($Cl_2$) as reactive gases and using the photoresist as an etching mask so that the metal electrode layer 41 in the opening portions of the photoresist is completely removed. Thereby, the metal electrodes 11 individually connected to the gate electrode 21, the drain region 5, and the source region 7 are formed separately in the respective contact holes 31 as shown in FIG. 1.

Thereafter, the photoresist is removed using nitric acid ($HNO_3$), whereby the N channel FET 20 in which the leakage stopping layer 13 is provided between the N source region 7 and the buried oxidation film 19 is completed as shown in FIG. 1.

In the same manner as the above, at a portion where the P channel FET is formed on the SOI substrate, N impurities (for example, phosphorus atoms) are implanted into the component region formed into an island shape out of the surface silicon layer of lightly doped P-type and diffused to form the lightly doped N region, and thereafter the P channel FET is formed similarly in the conventional manner. However, it is unnecessary to provide a leakage stopping layer in the P channel FET.

The semiconductor device in which the CMOS transistor is formed on the SOI substrate can be formed as described above.

When the support substrate 17 of the SOI substrate is grounded, it is suitable to provide a leakage stopping layer in the P channel FET and not to provide a leakage stopping layer in the N channel FET. In this case, since the conduction type of the P channel FET is N-type, the leakage stopping layer is made into high concentration N-type and the drain region and the source region are made into P-type. Phosphorus atoms, for example, are used as the N impurities to be implanted into the leakage stopping layer. The above configuration is not limited to the CMOS transistor and is also the same in the case where N channel FETs and P channel FETs are formed separately and in a mixed manner on an SOI substrate.

Through the aforementioned fabricating method of the semiconductor device according to the present invention, when the N channel FET and the P channel FET are formed on the SOI substrate 1 as the CMOS transistor, a leakage stopping layer with a high impurity concentration can be formed between the source region of any of the FETs and the buried oxidation film. Consequently, even if a potential difference arises between the lightly doped region of P-type or N-type of the FET and the support substrate when the semiconductor device is driven, the joining together of the depletion layer growing from the buried oxidation film side and the depletion layer growing from the source region side is avoided. Therefore, carriers are not supplied from the source region, thereby preventing a leakage current from flowing along the boundary surface between the lightly doped region and the buried oxidation film.

Effect of the invention

As has been described, since the semiconductor device according to the present invention is provided with the leakage stopping layer which is the same in conduction type as the lightly doped region formed out of the surface silicon layer and higher in impurity concentration than the lightly doped region between the source region of the field effect transistor of N-type or P-type formed on the SOI substrate and the buried oxidation film, the joining together of the depletion layer growing from the source region side and the depletion layer growing from the buried oxidation film is avoided even if there is a potential difference between the lightly doped region and the support substrate.

Therefore, even if an inversion layer is formed in the lightly doped region near the boundary surface between the lightly doped region and the buried oxidation film, carriers are not supplied from the source region into the inversion layer, thereby preventing a leakage current from appearing through the inversion layer, so that the channel current can be accurately controlled by the gate voltage.

What is claimed is:

1. A semiconductor device in which a field effect transistor is formed on an SOI substrate provided with a surface silicon layer above a support substrate made of silicon with a buried oxidation film therebetween, wherein:

a lightly doped region of N-type or P-type is formed at an area of the surface silicon layer surrounded by an insulator;

a gate electrode is provided above the lightly doped region with a gate oxidation film therebetween;

a drain region and a source region made by making the lightly doped region on the front face side different in conduction type from the lightly doped region are provided respectively on both sides of the gate electrode; and a leakage stopping layer which is the same in conduction type as the lightly doped region and higher in impurity concentration than the lightly doped region is provided between the source region and the buried oxidation film;

said leakage stopping layer is provided within an area, which contacts said buried oxidation film and does not contact said source region, in said lightly doped region.

2. A semiconductor device in which a field effect transistor is formed on an SOI substrate provided with a surface silicon layer above a support substrate made of silicon with a buried oxidation film therebetween, wherein:

a lightly doped region of N-type or P-type is formed at an area of the surface silicon layer surrounded by an insulator;

a gate electrode is provided above the lightly doped region with a gate oxidation film therebetween;

a drain region and a source region made by making the lightly doped region on the front face side different in conduction type from the lightly doped region are provided respectively on both sides of the gate electrode; and a leakage stopping layer which is the same in conduction type as the lightly doped region and higher in impurity concentration than the lightly doped region is provided between the source region and the buried oxidation film;

said leakage stopping layer is provided within an area, which contacts neither said source region nor said buried oxidation film, in said lightly doped region.

* * * * *